United States Patent
Cecil

(10) Patent No.: US 8,028,252 B2
(45) Date of Patent: Sep. 27, 2011

(54) TECHNIQUE FOR DETERMINING MASK PATTERNS AND WRITE PATTERNS

(75) Inventor: Thomas C. Cecil, Menlo Park, CA (US)

(73) Assignee: Luminescent Technologies Inc., Palo Alto, CA (US)

( * ) Notice: Subject to any disclaimer, the term of this patent is extended or adjusted under 35 U.S.C. 154(b) by 248 days.

(21) Appl. No.: 12/207,904

(22) Filed: Sep. 10, 2008

(65) Prior Publication Data

US 2009/0075183 A1 Mar. 19, 2009

Related U.S. Application Data

(60) Provisional application No. 60/972,692, filed on Sep. 14, 2007.

(51) Int. Cl.
*G06F 17/50* (2006.01)

(52) U.S. Cl. ............... 716/54; 716/52; 716/53; 716/55; 430/5

(58) Field of Classification Search ............ 716/52–55; 430/5
See application file for complete search history.

(56) References Cited

U.S. PATENT DOCUMENTS

| | | | |
|---|---|---|---|
| 5,242,770 A | 9/1993 | Chen et al. | |
| 5,707,765 A | 1/1998 | Chen | |
| 6,596,466 B1 | 7/2003 | Pohland et al. | |
| 6,733,929 B2 | 5/2004 | Pierrat | |
| 6,799,313 B2 | 9/2004 | LaCour | |
| 6,928,634 B2 * | 8/2005 | Granik et al. | 716/52 |
| 6,964,032 B2 * | 11/2005 | Liebmann et al. | 716/53 |
| 7,073,162 B2 | 7/2006 | Cobb et al. | |
| 7,353,145 B2 | 4/2008 | Tanaka et al. | |
| 7,509,621 B2 * | 3/2009 | Melvin, III | 716/51 |
| 7,552,416 B2 * | 6/2009 | Granik et al. | 716/50 |
| 7,721,246 B2 * | 5/2010 | Li et al. | 716/55 |
| 7,757,201 B2 | 7/2010 | Abrams et al. | |
| 7,793,253 B2 | 9/2010 | Abrams et al. | |
| 7,799,487 B2 * | 9/2010 | Hamouda | 430/5 |
| 2002/0028393 A1 | 3/2002 | Laidig et al. | |

(Continued)

FOREIGN PATENT DOCUMENTS

WO WO 2007/041701 A2 4/2007

OTHER PUBLICATIONS

WO 2009/036364 A1 (with International Search Report), Mar. 19, 2009, Luminescent Technologies, Inc.

(Continued)

*Primary Examiner* — Naum Levin
(74) *Attorney, Agent, or Firm* — Wilson Sonsini Goodrich & Rosati

(57) ABSTRACT

During a method for generating a third mask pattern to be used on a photo-mask in a photolithographic process, first features are added to a first mask pattern to produce a second mask pattern. A majority of the first features may have a size characteristic larger than a pre-determined value, and that the first features are topologically disconnected from second features in the first mask pattern that overlap third features in a target pattern. Moreover, the first features may be added at positions which are determined based on the gradient of a first cost function depending, at least in part, on the first mask pattern and the target pattern. Then, the third mask pattern may be generated based on the second mask pattern, where the photo-mask corresponds to the third mask pattern.

27 Claims, 6 Drawing Sheets

U.S. PATENT DOCUMENTS

| | | |
|---|---|---|
| 2002/0136494 A1 | 9/2002 | Yazaki et al. |
| 2002/0177050 A1 | 11/2002 | Tanaka |
| 2003/0140330 A1 | 7/2003 | Tanaka et al. |
| 2004/0005089 A1 | 1/2004 | Robles et al. |
| 2004/0068712 A1 | 4/2004 | Heng et al. |
| 2004/0210856 A1 | 10/2004 | Sanie et al. |
| 2004/0214096 A1 | 10/2004 | Dulman et al. |
| 2004/0229133 A1 | 11/2004 | Socha et al. |
| 2005/0136340 A1 | 6/2005 | Baselmans et al. |
| 2005/0142470 A1 | 6/2005 | Socha et al. |
| 2006/0046168 A1 | 3/2006 | Fukuhara |
| 2006/0172204 A1 | 8/2006 | Peng et al. |
| 2007/0198963 A1 | 8/2007 | Granik et al. |
| 2008/0301620 A1* | 12/2008 | Ye et al. ............ 716/19 |

OTHER PUBLICATIONS

WO 2007/041701 A3 (International Search Report), Apr. 12, 2007, Luminescent Technologies, Inc.

WO 2006/078791 A3 (International Search Report), Jul. 27, 2006, Luminescent Technologies, Inc.

WO 2006/078791 A2 (Without International Search Report), Jul. 27, 2006, Luminescent Technologies, Inc.

\* cited by examiner

TECHNIQUE FOR DETERMINING MASK PATTERNS AND WRITE PATTERNS

CROSS-REFERENCE

This application claims the benefit of U.S. Provisional Application No. 60/972,692, filed Sep. 14, 2007, which application is incorporated herein by reference.

BACKGROUND OF THE INVENTION

1. Field of the Invention

The present invention relates to systems and techniques for determining write patterns for maskless-lithography processes that use write devices and mask patterns for photolithography processes that use photo-masks.

2. Related Art

Lithography processing represents an essential technology for manufacturing Integrated Circuits (IC) and Micro Electro-Mechanical Systems (MEMS). Lithographic techniques are used to define patterns, geometries, features, shapes, etc. onto an integrated-circuit die, semiconductor wafer, or chips, where the patterns are typically defined by a set of contours, lines, boundaries, edges, curves, etc., which generally surround, enclose, and/or define the boundary of the various regions which constitute the patterns.

One existing lithographic technique is photolithography, in which images defined by photo-masks are printed onto the integrated-circuit die or the semiconductor wafers. Furthermore, another existing lithographic technique is maskless lithography, in which a write device directly prints a write pattern onto the integrated-circuit die or the semiconductor wafers, thereby eliminating the need for photo-masks. Unfortunately, it is increasingly difficult to determine the write patterns, or to design and manufacture photo-masks.

In particular, demand for increased density of features on the integrated-circuit die and semiconductor wafers has resulted in the design of circuits with decreasing minimum dimensions. These trends have significantly increased the complexity of the computations necessary to determine the write patterns and/or the mask patterns (to which the photo-masks correspond), with a commensurate impact on computation time, processing requirements, and expense.

Furthermore, due to the wave nature of light, as dimensions approach sizes comparable to the wavelength of the light used in the photolithography processes, the resulting wafer patterns deviate from the corresponding photo-mask patterns and are accompanied by unwanted distortions and artifacts. Existing techniques (such as Optical Proximity Correction or OPC, and Resolution Enhancement Technologies or RET) are used to pre-distort the mask patterns to improve resolution and/or a process window (i.e., a range of process conditions that result in acceptable yield) in a photolithography process.

While these techniques may ensure that the wafer pattern is printed more accurately, determining the pre-distorted mask patterns is increasingly difficult, thereby exacerbating the computational complexity and the associated problems. For example, computing the pre-distorted mask patterns may be complicated by the presence of multiple potential solutions (such as local minima) in a higher-dimensional solution space. Moreover, while many of these solutions may produce similar wafer patterns, it may be easier to manufacture photo-masks corresponding to some of the solutions than others. Consequently, identifying a suitable pre-distorted mask pattern may be time-consuming and expensive.

Hence, what is needed is a method and an apparatus that facilitates determination of write patterns and mask patterns without the above-described problems.

SUMMARY OF THE INVENTION

One embodiment of the present invention provides a method for generating a third mask pattern to be used on a photo-mask in a photolithographic process. During this method, first features are added to a first mask pattern to produce a second mask pattern. Note that a majority of the first features have a size characteristic larger than a predetermined value, and that the first features are topologically disconnected from second features in the first mask pattern that overlap third features in a target pattern. Moreover, the first features are added at positions which are determined based on the gradient of a first cost function depending, at least in part, on the first mask pattern and the target pattern. Then, the third mask pattern is generated based on the second mask pattern, where the photo-mask corresponds to the third mask pattern.

In some embodiments, the first features include sub-resolution assist features.

In some embodiments, the positions correspond to extrema in the gradient, such as a local maximum. Moreover, a given feature in the first features may be positioned based on an average of the gradient over a given region in the first mask pattern. In some embodiments, the first features are positioned based on one or more pre-defined rules.

In some embodiments, the size characteristic is determined based on manufacturing capability of the photo-mask in the photolithographic process. Moreover, the size characteristic may be a fraction of a ratio of a wavelength of light used in the photolithographic process divided by a numerical aperture of an optical path in the photolithographic process. For example, the size characteristic may be at least 20 nm.

In some embodiments, the first mask pattern is defocused prior to adding the first features. Moreover, contrast in the first mask pattern may be enhanced prior to adding the first features.

In some embodiments, a rectilinear projection that approximately conserves areas of enclosed contours in the third mask pattern is performed.

In some embodiments, the first cost function includes a magnitude of a difference between the target pattern at the image plane and a projection of another photo-mask, corresponding to the first mask pattern, at the image plane in the photolithographic process.

In some embodiments, a second cost function corresponding to the second mask pattern and the target pattern includes a different weighting than the first cost function, and the weighting of the second cost function increases at locations further from the edge. For example, the second cost function may include a magnitude of a difference between the target pattern at the image plane and a projection of another photo-mask, corresponding to the second mask pattern, at the image plane in the photolithographic process.

In some embodiments, the third mask pattern has a third cost function relative to the target pattern at the image plane. This third cost function may include a magnitude of a difference between the target pattern at the image plane and a projection of the photo-mask at the image plane in the photolithographic process.

Note that the first features may accelerate convergence during the generating of the third mask pattern. In some embodiments the convergence is based on a summed value of the third cost function corresponding to the third mask pattern. Moreover, the convergence may be based on a manufacturability of the photo-mask corresponding to the third mask pattern.

In some embodiments, the generating of the third mask pattern involves calculating the gradient of the third cost function. Moreover, the generating of the third mask pattern may involve an optical proximity correction and/or an inverse lithographic calculation (which includes a projection of the target pattern at an object plane in the photolithographic process).

In some embodiments, adding the first features increases a second summed value of the second cost function relative to a first summed value of the first cost function. Moreover, the third cost function corresponding to the third mask pattern may have a third summed value that is less than the second summed value.

In some embodiments, the first mask pattern is first received and/or determined.

Another embodiment provides a computer system configured to execute instructions corresponding to at least some of the above-described operations.

Another embodiment provides a computer-program product for use in conjunction with the computer system.

Another embodiment provides a semiconductor wafer. This semiconductor wafer is produced in the photolithography process that uses the photo-mask.

Another embodiment provides the photo-mask.

Another embodiment provides a data file stored in a computer-readable memory that includes information corresponding to the mask pattern.

Another embodiment provides a method in which at least some of the above-described operations are used for generating a write pattern (instead of a mask pattern) to be used in a maskless-lithographic process.

Another embodiment provides a data file stored in a computer-readable memory that includes information corresponding to the write pattern.

Another embodiment provides a method for generating a third mask pattern to be used on a photo-mask in a photolithographic process (or a write pattern to be used in a maskless-lithographic process). During this method, first features are added to a first mask pattern to produce a second mask pattern. Note that a majority of the first features are single rectangles, and that the first features are topologically disconnected from second features in the first mask pattern that overlap third features in a target pattern. Moreover, the first features are added at positions which are determined based on the gradient of a first cost function depending, at least in part, on the first mask pattern and the target pattern. Then, the third mask pattern is generated based on the second mask pattern, where the photo-mask corresponds to the third mask pattern.

Another embodiment provides a method for generating a third mask pattern to be used on a photo-mask in a photolithographic process (or a write pattern to be used in a maskless-lithographic process). During this method, a first mask pattern is filtered, where this filtering includes defocusing the first mask pattern. Then, first features are added to a first mask pattern to produce a second mask pattern. Note that the first features are topologically disconnected from second features in the first mask pattern that overlap third features in a target pattern. Moreover, the first features are added at positions which are determined based on the gradient of a first cost function depending, at least in part, on the first mask pattern and the target pattern.

Another embodiment provides a method for generating a third mask pattern to be used on a photo-mask in a photolithographic process (or a write pattern to be used in a maskless-lithographic process). During this method, first features are added to a first mask pattern to produce a second mask pattern. Note that the first features are topologically disconnected from second features in the first mask pattern that overlap third features in a target pattern. Moreover, the first features are added at positions which are determined based on the gradient of a first cost function depending, at least in part, on the first mask pattern and the target pattern. Then, the third mask pattern is generated based on the second mask pattern, where the generating involves evolving the positions and shapes of the first features, and the photo-mask corresponds to the third mask pattern.

In some embodiments, the evolving is image based and/or gradient-flow based. Moreover, the evolving may involve optical-proximity correction and/or a side-lobe-suppression calculation. For example, during the side-lobe-suppression calculation an estimated pattern at the image plane is determined using a current photo-mask corresponding to a current mask pattern, and the current mask pattern is modified to eliminate side-lobe printing.

INCORPORATION BY REFERENCE

All publications, patents, and patent applications mentioned in this specification are herein incorporated by reference to the same extent as if each individual publication, patent, or patent application was specifically and individually indicated to be incorporated by reference.

BRIEF DESCRIPTION OF THE DRAWINGS

Note that like reference numerals refer to corresponding parts throughout the drawings.

DETAILED DESCRIPTION OF THE INVENTION

Figure 1:
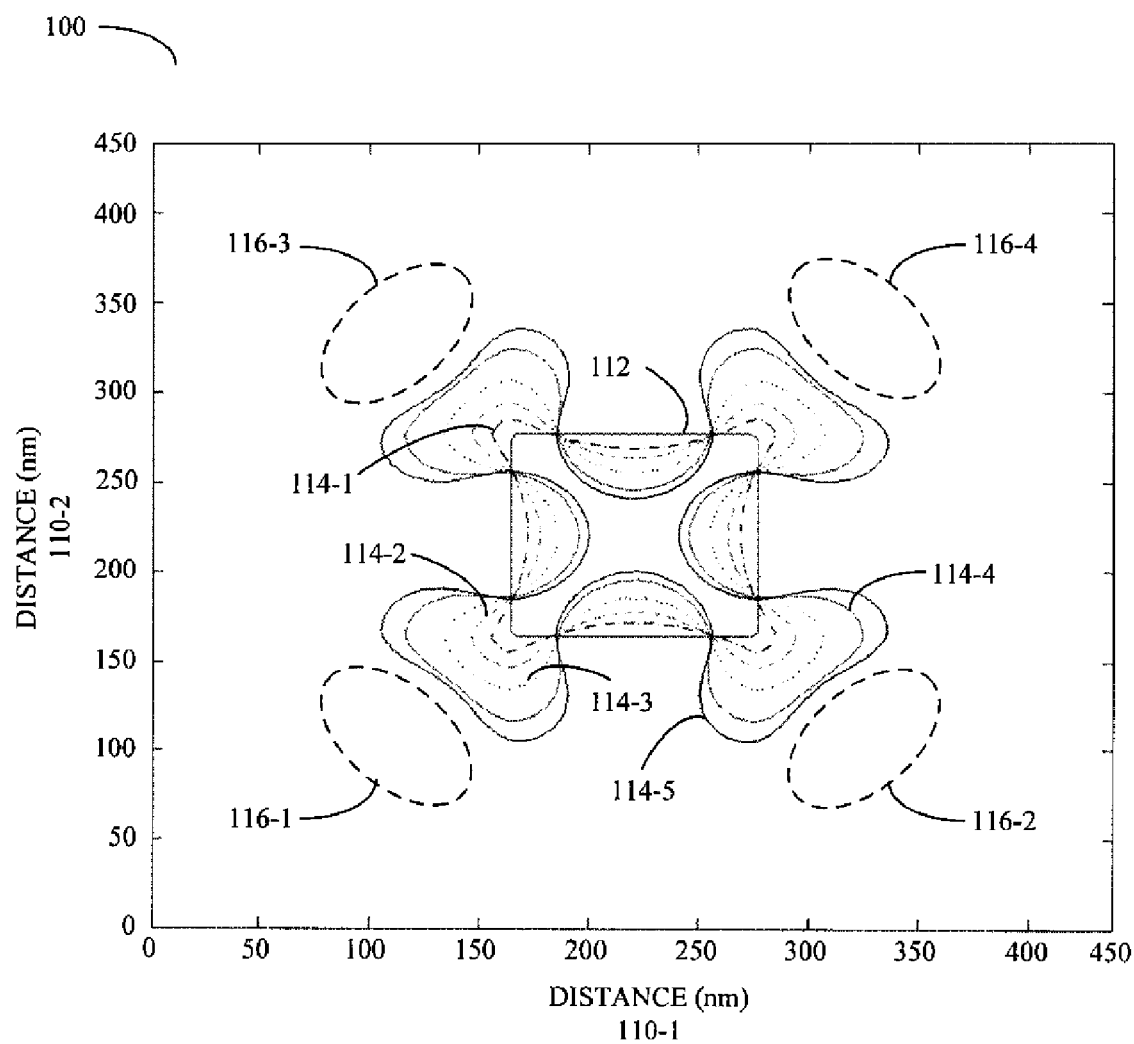
FIG. 1 is a block diagram illustrating the iterative determination of a mask pattern and/or a write pattern in accordance with an embodiment of the present invention.

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Embodiments of a computer system, a method, a computer program product (i.e., software), and a data structure or a file for use with the computer system are described. These systems, processes, and/or data structures may be used to determine or generate mask patterns that are used to produce photo-masks, which in turn are used to produce integrated-circuit die and/or semiconductor wafers (henceforth referred to as semiconductor wafers) during a photolithographic process. Furthermore, in some embodiments the systems, processes, and/or data structures are used to determine or generate write patterns that are used to produce the semiconductor wafers during a maskless-lithographic process (such as a process that uses a direct write device). In particular, the photo-mask may be used to project an aerial image or print a pattern (henceforth referred to as the printed pattern) corresponding to a target pattern in a design (such as a design layer in an integrated circuit) on to a semiconductor wafer. Alternatively, a write device (such as a laser writer or an e-beam writer) may use the write pattern to write a pattern on to the semiconductor wafer. In the discussion that follows, determination or generating of a mask pattern is used as an illustrative example.

In some embodiments, the mask pattern is modified during the generating to accelerate convergence on a given solution out of multiple potential solutions (such as local minima in a multi-dimensional space). This solution may correspond to a photo-mask that produces the printed pattern at an image plane in an optical path used in the photolithographic process, and structures, shapes, or lines (henceforth referred to as features) in this printed pattern may be positioned within a design tolerance relative to the target pattern (such as ±10%). Moreover, in some embodiments the given solution corresponds to a photo-mask that is less complex, has a higher yield, and/or has lower cost than other solutions.

In particular, one or more additional features may be added to the mask pattern at the start of and/or in the middle of the generating process (i.e., may be added to an initial version of the mask pattern to produce a modified version of the mask pattern). These additional features: may be larger than a minimum size; may have a minimum spacing; may have a minimum width; may be single rectangles (for example, a majority of the additional features may be single rectangles); may be topologically disconnected from (i.e., do not connect or overlap with) other features in the mask pattern that overlap desired features in the target pattern; and/or may be proximate to an edge of one or more of the other features in the mask pattern. For example, the additional features may include sub-resolution assist features (SRAFs). These additional features may improve the printed pattern (for example, by reducing errors relative to the target pattern).

In some embodiments the additional features are added at positions which are determined based on: the gradient of an initial cost function corresponding to the initial version of the printed pattern (associated with a photo-mask that corresponds to the initial version of the mask pattern) and the target pattern (such as a weighted sum of the magnitude of the difference between the printed pattern and the target pattern raised to a power n, where n is a real number); and/or pre-defined rules (such as those used in Optical Proximity Correction or OPC). For example, some additional features may be added at positions based on the gradient and other additional features may be added at positions based on OPC. Note that after adding the additional features (and prior to continuing the generating) a modified cost function (associated with the modified version of the mask pattern) may be increased relative to the initial cost function.

We now describe embodiments of a system or technique for determining or generating mask patterns and/or write patterns. FIG. 1 presents a block diagram illustrating an embodiment 100 of the iterative determination of a mask pattern and/or a write pattern. In this diagram, a desired feature 112 in a target pattern is illustrated along with a series of features 114 in a corresponding mask pattern as a function of distance 110. Note that the series of features 114 iteratively evolve (from feature 114-1 to feature 114-5) during the determining or generating of the mask pattern.

In order to determine a mask pattern that results in a printed pattern at the image plane that has a better correspondence to the desired feature 112 or that corresponds to an improved photo-mask (for example, one that is easier or cheaper to manufacture), additional features 116 may be added to the mask pattern. These additional features may be added at the start and/or during the determining of the mask pattern. Furthermore, after adding the additional features 116, the determining or generating of the mask pattern may start and/or may continue. During these subsequent calculations, the position and/or shape of one or more of the additional features 116 may evolve.

The final positions and/or shapes of additional features 116 may improve attributes (local and/or non-local) of the printed image other than those that immediately overlap with the additional features 116. In particular, the additional features 116 may not result in corresponding features in the aerial image that print directly. Instead, the additional features 116 may modify features (such as feature 112) that do print. In an example embodiment, therefore, the additional features 116 may include SRAFs.

Note that the additional features 116 may have a variety of characteristics. In particular, the additional features 116 may have one or more minimum characteristics (such as a minimum size, spacing, and/or width) that is based on manufacturing capability of the photo-mask in the photolithographic process. Thus, the minimum characteristic may be a fraction of $\lambda/NA$, where $\lambda$ is a wavelength of light used in the photolithographic process and NA is a numerical aperture of the optical path in the photolithographic process. In an example embodiment, the minimum size is at least 20 nm.

Moreover, the additional features 116 may be proximate to an edge of a feature in the mask pattern, such as an edge of one of the features 114 at an intermediate portion of the iterative calculation (for example, feature 114-3). In addition, the additional features 116 may be topologically disconnected from other features in the mask pattern, such as feature 114-3. In an example embodiment, one or more of the additional features 116 initially has a simple shape, such as a single rectangle. As noted above, this initial shape and/or the positions of the additional features 116 may evolve during subsequent calculations.

The resulting mask pattern may be used to produce a photo-mask that is used in a photolithographic process. In some embodiments, the source in this process includes: one or more lamps (including I line, g line, a wavelength of 193 mm, a wavelength of 248 nm, immersion, and/or any other optical lithography wavelength in air, water, or another fluid or gas), a laser, and/or an electron-beam source. Moreover, the source may be configured to provide: off-axis illumination, dipole illumination, quadrupole illumination, quasar illumination, incoherent illumination, coherent illumination, and/or any arbitrary illumination pattern.

Note that in some embodiments, the mask pattern and/or the write pattern illustrated in FIG. 1 (as well as the embodiments described below) may include fewer or additional features, two or more features may be combined into a single component, and/or a position of one or more features may be changed.

Figure 2A:
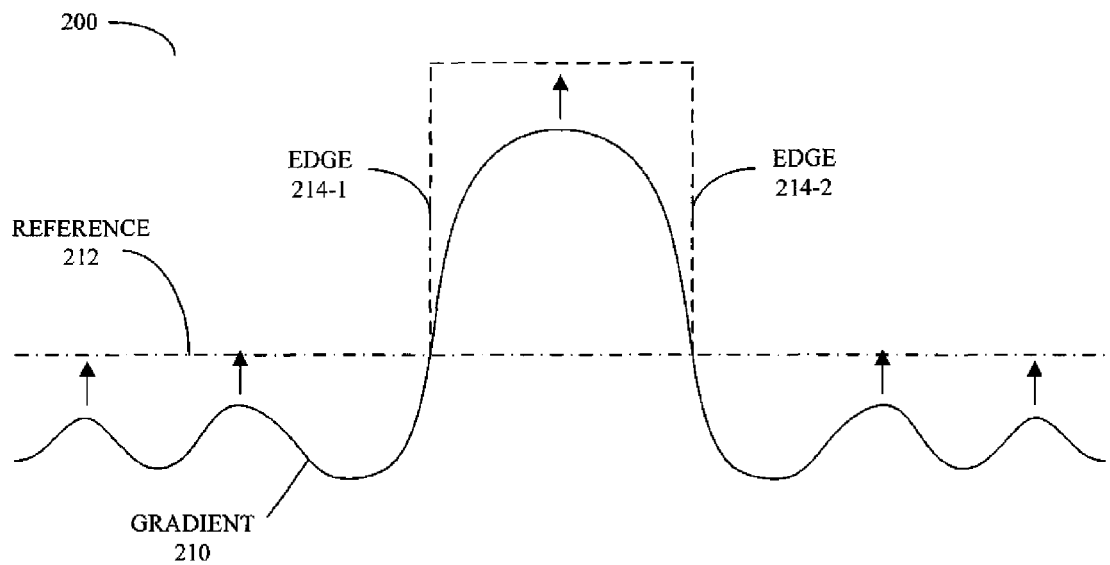
FIG. 2A is a block diagram illustrating the determination of the mask pattern and/or the write pattern in accordance with an embodiment of the present invention.

FIG. 2A presents a block diagram illustrating an embodiment 200 of the determination of the mask pattern and/or the write pattern. During the determining, features in the mask pattern may correspond to portions of the gradient 210 of a cost function (associated with the mask pattern) that exceed one or more thresholds or reference levels, such as reference level 212. Note that different portions of the mask pattern may have different reference levels. Also note that a given feature may have edges 214.

Figure 2B:
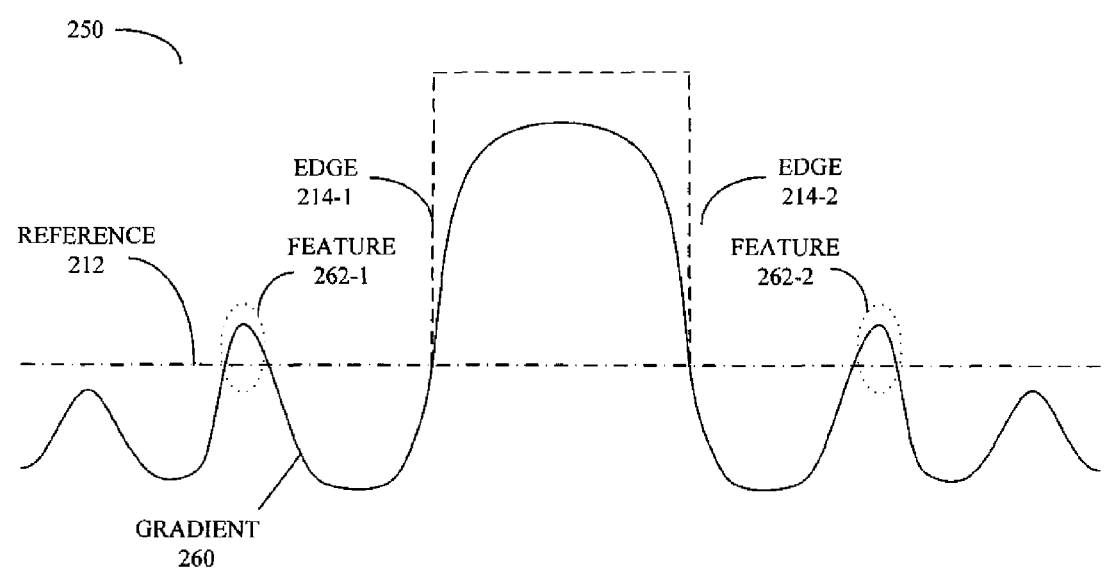
FIG. 2B is a block diagram illustrating the determination of the mask pattern and/or the write pattern in accordance with an embodiment of the present invention.

Gradient 210 includes multiple local extrema, such as maxima and minima. These extrema may evolve during the iterative calculations (as illustrated by the arrows in embodiment 200). Consequently, some of the extrema may eventually exceed the reference level 212, thereby producing new features in the mask pattern. This is shown in FIG. 2B, which presents a block diagram illustrating an embodiment 250 of the determination of the mask pattern and/or the write pattern in which new features 262 occur at extrema of gradient 260.

To accelerate this result of the iterative process, additional features may be added to the mask pattern based on the gradient at positions where such features may occur in subsequent iterations of the calculations or should occur (in order to generate an improved printed pattern and/or photo-mask). In some embodiments, the additional features are added at positions that correspond to a local maxima in the gradient of a cost function (associated with an initial version of the mask pattern prior to the adding of the additional features) or the average of the gradient of the cost function over a given region in the mask pattern (which is discussed below with reference to FIG. 3).

A variety of cost functions may be used during the determination of the mask pattern. For example, a first cost function prior to the adding of the addition features may include a magnitude of a difference between the target pattern and an estimated printed pattern (to be produced by a first photo-mask corresponding to the initial version of the mask pattern).

In some embodiments, one or more operations are performed prior to adding the additional features to assist in identifying where to place the additional features and/or what shape these additional features should have. For example, the mask pattern may be defocused prior and/or contrast in the mask pattern may be enhanced prior to adding the additional features.

In some embodiments, the additional features are added at positions that are determined based on a second cost function. This second cost function may use the same weights and/or different weights than used when determining the first cost function and these weights may enhance contrast (as opposed to a cost function and/or weights that enhance a sensitivity to errors in the placement of edges 214 in FIG. 2A in the mask pattern). In an example embodiment the weights may increase (for example, 100×) at locations further away from an edge (such as edge 214-1 in FIG. 2A) in the initial version of the mask pattern (such as 10-40 nm from the edge). And in some embodiments a margin of the target pattern may be increased when determining the second cost function (for example, from 5% to 40%).

After adding the additional features, the weights used when determining the first cost function may be used to determine a third cost function associated with the modified version of the mask pattern. Note that a summed value of this cost function may be increased relative to that for the first cost function.

Then, the generating of the mask pattern may continue until a solution is reached (i.e., the generating converges to a final version of the mask pattern). During this portion of the generating of the mask pattern, positions and/or shapes of the additional features may evolve. Therefore, a fourth cost function associated with the final version of the mask pattern may have a summed value that is less than that for the third cost function. Note that in some embodiments the convergence during the generating of the mask pattern is based on: the summed value of the fourth cost function and/or a manufacturability of the photo-mask corresponding to the final version of the mask pattern.

In some embodiments, the generating of the final version of the mask pattern involves: OPC and/or an inverse lithographic calculation (in which the mask pattern is determined by calculating the projection of the target pattern at an object plane in the photolithographic process). For example, at least some additional features may be added, at least in part, based on pre-determined rules (such as those used in OPC). Moreover, in some embodiments the additional features are added at the start of and/or during an inverse lithographic calculation.

In some embodiments, the generating of the mask pattern is image based and/or gradient-flow based. Moreover, the generating of the mask pattern may involve a side-lobe-suppression calculation. For example, during the side-lobe-suppression calculation an estimated printed pattern at the image plane is determined and a current version of the mask pattern is modified to eliminate side-lobe printing (i.e., eliminating unwanted printing that is associated with side-lobes of the additional features by evolving the positions and/or shapes of the additional features).

In some embodiments, the calculations during the generating of the mask pattern include determining an estimated developed wafer pattern using a model of the lithographic process. This model may include a photo-resist model.

As noted previously, the initial version of the mask pattern prior to adding the additional features may be an intermediate result in a series of iterative calculations. However, in some embodiments the initial version of the mask pattern is received from another source, such as another computation program or a third party that would like an improved version of the mask pattern to be determined or generated.

As also noted previously, generating of the initial, modified, and/or final version of the mask pattern is based on the target pattern. In some embodiments, an initial format of the target pattern may be converted prior to these calculations. For example, the target pattern may be converted from a hierarchical representation (such as GDSII and/or OASIS) to a second format, such as a pixel-based representation or a format having fewer levels than the original format. Thus, in some embodiments the initial format and/or the second format may include a pixel-based format (i.e., spatially discrete) data patterns (such as bitmap and/or grayscale images), binary patterns, and/or continuous-tone patterns. Furthermore, after the write pattern and/or the mask pattern is generated, a format of the write pattern and/or the mask pattern may be converted back to the original format of the target pattern.

Figure 3:
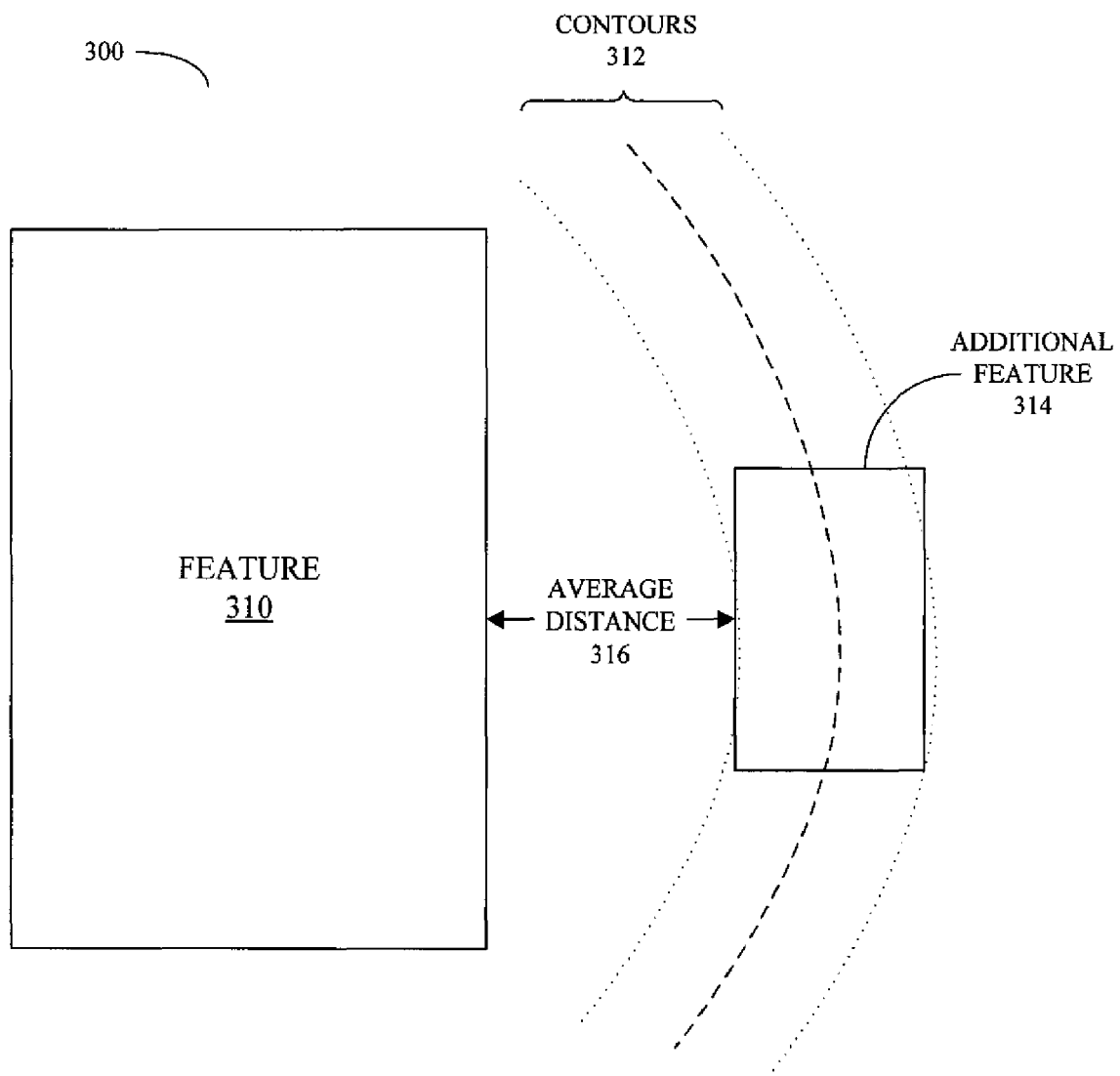
FIG. 3 is a block diagram illustrating the placement of an additional feature while determining the mask pattern and/or the write pattern in accordance with an embodiment of the present invention.

FIG. 3 presents a block diagram illustrating an embodiment 300 of the placement of an additional feature 314 while determining the mask pattern and/or the write pattern. Note that the additional feature 314 is initially positioned an average distance 316 from an existing feature 310 in the mask pattern. Also note that the additional feature 314 is (at least initially) a single rectangle.

In some embodiments, the position of the addition features (such as additional feature 314) is based on values of the gradient over a region in the mask pattern (as opposed to a local value, such as an extrema). For example, the average of the gradient over a given region in the mask pattern (such as that illustrated by gradient contours 312) may be used. Note that while the additional feature 314 is shown parallel to an edge, in other embodiments it may be placed with an arbitrary orientation in the plane of the mask pattern (for example, along a diagonal of the feature 310).

Figure 4:
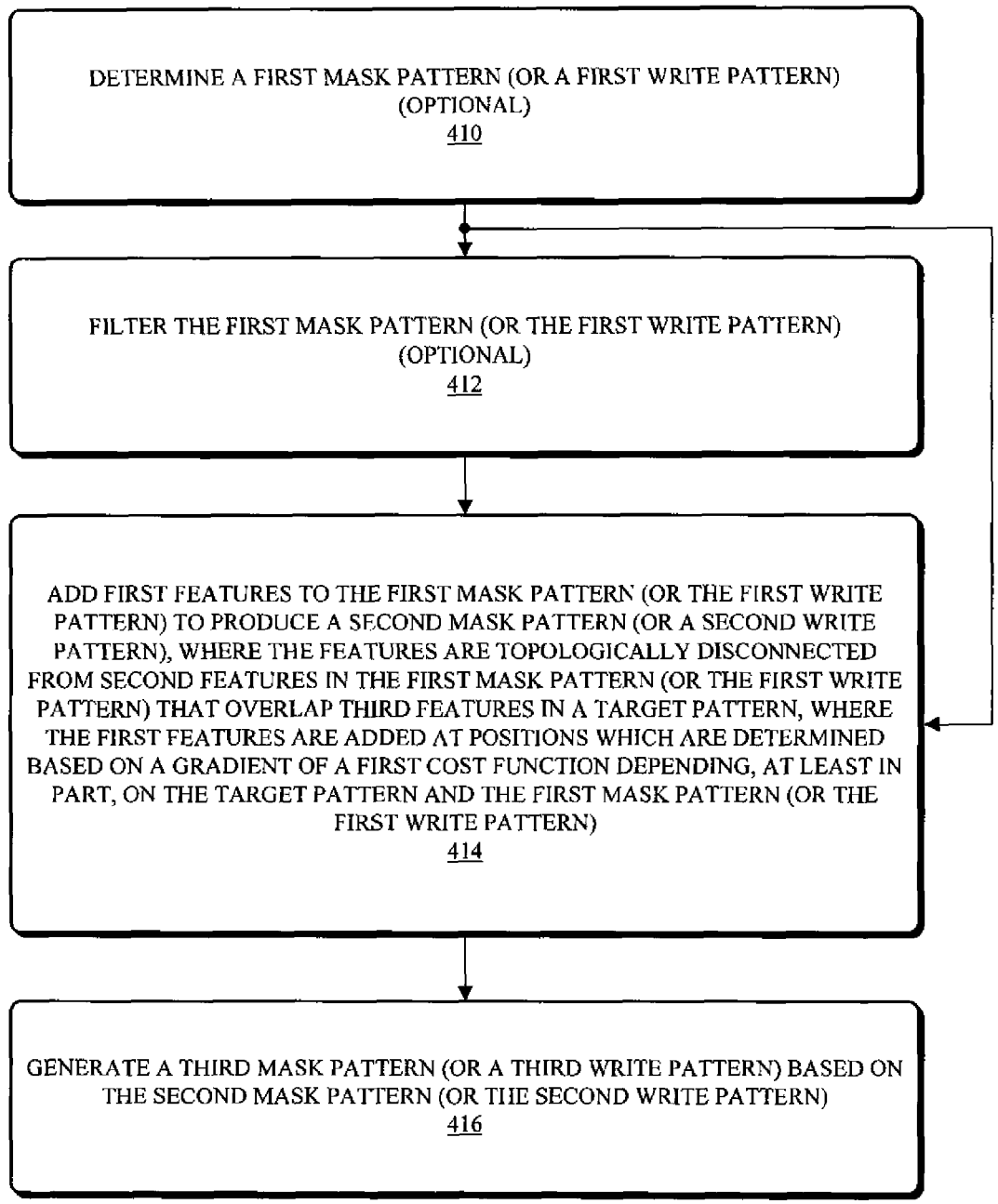
FIG. 4 is a flowchart illustrating a process for generating the mask pattern and/or the write pattern in accordance with an embodiment of the present invention.

We now describe embodiments of processes for generating write patterns and/or mask patterns. FIG. 4 presents a flowchart illustrating a process 400 for generating the mask pattern and/or the write pattern. During this process, a computer system optionally determines a first mask pattern (or a first write pattern) (410) and/or optionally filters the first mask pattern (or the first write pattern) (412). This filtering (412) may defocus and/or enhance contrast of the first mask pattern (or the first write pattern).

Then, the computer system adds first features to the first mask pattern (or the first write pattern) to produce a second mask pattern (or the second write pattern) (414). Note that a majority of the first features are topologically disconnected from second features in the first mask pattern (or the first write pattern) that overlap third features in a target pattern at an image plane in the photolithographic process. Moreover, the first features are added at positions which are determined based on the gradient of a first cost function depending, at least in part, on the first mask pattern (or the first write pattern) and the target pattern.

Next, the computer system generates a third mask pattern (or a third write pattern) (416) based on the second mask pattern (or the second write pattern), where the photo-mask corresponds to the third mask pattern.

Note that in some embodiments of the process 400 there may be: additional or fewer operations, the order of the operations may be changed, and/or two or more operations may be combined into a single operation. For example, during and/or after the generating (416) a rectilinear projection (sometimes referred to as a Manhattanizing operation) that approximately conserves areas of enclosed contours in the third mask pattern may be performed.

We now describe embodiments of an inverse calculation (such as an inverse lithography calculation) that may be used to determine or generate one or more write patterns and/or mask patterns. This inverse calculation may be based on minimization of an error function (which is also sometimes referred to as a cost function or a Hamiltonian function). During each iteration of the calculation, an error function may be a function of the difference between the estimated wafer pattern that results when the aerial image or printed pattern associated with the write pattern or the mask pattern is projected through an optical path in the optical system during a lithographic process. In some embodiments, multiple images may be used, such as those corresponding to a range of process conditions or multiple exposures.

A forward calculation may also be used when determining the cost function. In the discussion that follows, coherent illumination by an illumination pattern associated with the source in the lithographic process is assumed. Furthermore, the electric field falling on the photo-mask (which is associated with the mask pattern) or provided by a write device (based on the write pattern) is approximately constant. Using photo-lithography as an example, note that some regions of the photo-mask (such as those corresponding to '0s' in a binary mask pattern) reflect the light to the semiconductor wafer at the image plane of the optical system, while other regions (such as those corresponding to '1s' in the binary mask pattern) do not reflect the light to the semiconductor wafer. It follows that a scalar electric field E after reflection off of the photo-mask (which is henceforth referred to as an image pattern), may be expressed as $$E(\vec{r}) = \left\{ \begin{array}{c} 0 \\ 1 \end{array} \right\},$$

where $\vec{r}=(x, y)$ is a point on the (x,y) plane. (More generally, the electric field may included grayscale values in the range $\{-1, 1\}$ or arbitrary complex numbers that correspond to the features of the photo-mask. Thus, chrome-on-glass photo-masks and various types of photo-masks other than chrome on glass, such as attenuated phase shifting, strong phase shifting, other materials, etc., are within the scope of the present invention.) Note that this representation of the image pattern may be re-expressed using a function $\phi$ (referred to as a level-set function) having positive regions that indicate light reflected to the semiconductor wafer and negative regions that indicate an absence of light reflected to the semiconductor wafer. Sore generally, the level-set function may have two or more levels and a given mask pattern or write pattern may be represented by one or more level-set functions.) Furthermore, the level-set function may equal zero at the boundaries or contours of features of the photo-mask. Therefore, the electric field E associated with the photo-mask (and thus, the mask pattern) may be re-expressed as a function of this level-set function, i.e., $$E(\vec{r}) = \hat{h}(\phi(x,y)),$$

where $\hat{h}$ is the transmission or reflection function $$\hat{h}(x) = \left\{ \begin{array}{cc} 1 & x \geq 0 \\ 0 & x < 0 \end{array} \right\}.$$

Since an ideal diffraction limited lens acts as a low-pass filter, this may be used as an approximation to the actual (almost but not quite perfect) optics in the optical path in the optical system. Mathematically, the action of a lens may be expressed as $$A(\vec{r}) = f^{-1}(\hat{C}(f(E(\vec{r}))))$$

where $A(\vec{r})$ indicates the electric field distribution on the wafer, f indicates the Fourier transform, $f^{-1}$ indicates the inverse Fourier transform, and $\hat{C}$ indicates the pupil cutoff function, which is zero for frequencies larger than a threshold determined by the numerical aperture of the lens, and one otherwise. Thus, the pupil function is $$\hat{C}(k_x, k_y) = \hat{h}(k_{max}^2 - [k_x^2 + k_y^2]) = \left\{ \begin{array}{cc} 0 & k_x^2 + k_y^2 \geq k_{max}^2 \\ 1 & k_x^2 + k_y^2 < k_{max}^2 \end{array} \right\},$$

wherein $k_x$, $k_y$ and $k_{max}$, represent frequency coordinates in Fourier space. Therefore, the intensity pattern on the semiconductor wafer is simply the square of the electric field $$I(\vec{r}) = |A(\vec{r})|^2.$$

Combining these two equations, we find $$F(\phi(x,y)) = (|f^{-1}(\hat{C}(f(\hat{h}(\phi(x,y)))))|^2)$$

This is a self-contained formula for the intensity pattern at the semiconductor wafer.

Note that this is just one embodiment of the forward calculation that can be used within the scope of this invention, chosen by way of example due to its relative simplicity. More sophisticated forward models also fall within the scope of the present invention. Such models may take into account, by way of example but not limitation: various illumination conditions (e.g., off-axis, incoherent), the actual electromagnetics of the light field interacting with the photo-mask, the polarization of the light field, the actual properties of the lens (such as aberrations), and/or the vector nature of the electromagnetic field as it propagates through the optical path in the optical system during the lithographic process.

In some embodiments, during each iteration of the inverse calculation the level-set function corresponding to the mask pattern and/or the write pattern is updated according to $$\phi_{i+1} = \phi_i + \Delta\phi = \phi_i + \Delta t \cdot \nabla(H),$$

where $\phi_{i+1}$ is an updated version of the level-set function, $\phi_i$ is the current version of the level-set function, $\Delta t$ is a step size in the calculation and $\nabla(H)$ is a gradient or a derivative of the error function. Note that $\nabla(H)$ is $$\left.\frac{\delta H}{\delta \phi}\right|_{\varphi_i},$$

i.e., it is the Frechet derivative of the cost function H. Furthermore, in some embodiments $\nabla(H)$ is the direction of steepest descent for minimizing or optimizing H by changing $\phi$. Furthermore, in some embodiments a $1^{st}$ order and/or a $3^{rd}$ order Runge-Kutta method is used when updating $\phi_i$. In other embodiments, a Conjugate Gradient technique, a Levenberg-Marquardt technique, a Quasi-Newton technique, and/or a Simplex technique may be used.

At least some aspects of Simulated Annealing may be utilized in some embodiments of the inverse calculation. In particular, the error function H may be allowed to increase during some iterations as the calculation evolves. In this way, the global minimum in the multi-dimensional space may be determined. Note that the size of this multi-dimensional space is proportional to a number of quantization levels to the power of the number of pixels in the mask pattern or the write pattern. In an example embodiment, these patterns or images have at least 1 million pixels (for example, 1024×1024).

In some embodiments the inverse calculation is divided into a series of overlapping work units, at least some of which are processed independently and/or concurrently. These work units may be based on features or structures (for example, repetitive structures) in the mask pattern or the write pattern.

In some embodiments, the inverse calculation is run for 100, 1000 or 10,000 iterations at which point the optimal solution has been determined. In other embodiments, the calculation is stopped based on convergence criteria, such as: oscillatory behavior; a relative and/or absolute difference between the target pattern and an estimate of the printed pattern or developed wafer pattern; the latest change to the error function H; and/or the history of changes to the error function H. For example, the relative difference may be less than 1% and/or the absolute difference may be 10 nm for a critical dimension of 100 nm.

Figure 5:
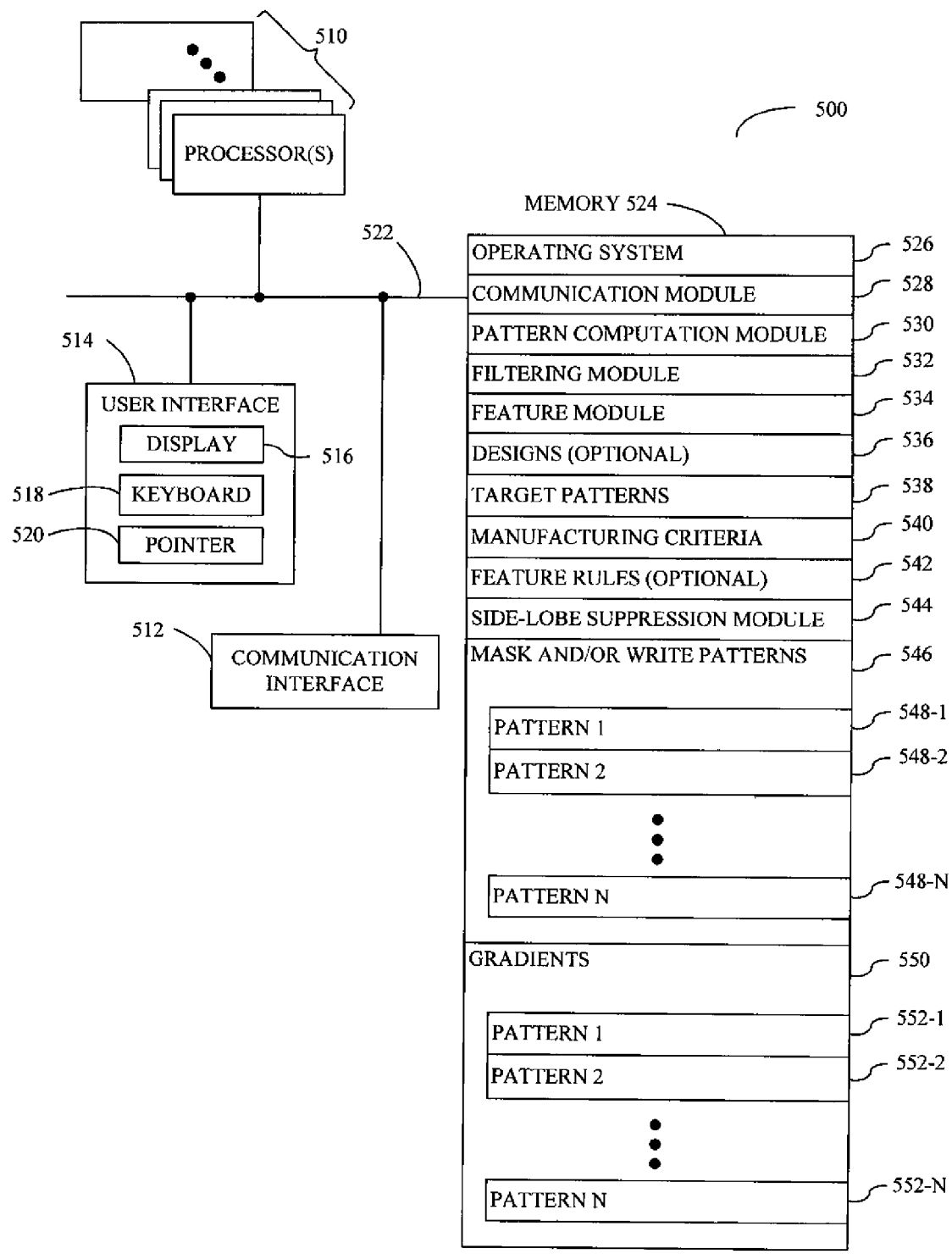
FIG. 5 is a block diagram illustrating a computer system to generate the mask pattern and/or the write pattern in accordance with an embodiment of the present invention.

We now describe embodiments of computer systems that perform the determining or generating of the mask patterns and/or write patterns. FIG. 5 presents a block diagram illustrating a computer system 500 to generate a mask pattern and/or a write pattern in accordance with an embodiment of the present invention. Computer system 500 includes multiple processors 510 or processor cores, a communication interface 512, a user interface 514, and one or more signal lines 522 coupling these components together. Note that the processing units 510 support parallel processing and/or multi-threaded operation, the communication interface 512 may have a persistent communication connection, and the one or more signal lines 522 may constitute a communication bus. Moreover, the user interface 514 may include a display 516, a keyboard 518, and/or a pointer 520, such as a mouse.

Memory 524 in the computer system 500 may include volatile memory and/or non-volatile memory. More specifically, memory 524 may include ROM, RAM, EPROM, EEPROM, FLASH, one or more smart cards, one or more magnetic disc storage devices, and/or one or more optical storage devices. Memory 524 may store an operating system 526 that includes procedures (or a set of instructions) for handling various basic system services for performing hardware dependent tasks. The memory 524 may also store communications procedures (or a set of instructions) in a communication module 528. The communication procedures may be used for communicating with one or more computers, devices and/or servers, including computers, devices and/or servers that are remotely located with respect to the computer system 500.

Memory 524 may also include one or more program modules (or a set of instructions), including pattern computation module 530 (or a set of instructions), filtering module 532 (or a set of instructions), feature module 534 (or a set of instructions), and/or side-lobe suppression module 544 (or a set of instructions). Furthermore, memory 524 may include: optional designs 536, target patterns 538, manufacturing criteria 540, optional feature rules 542 (such as OPC rules), mask patterns and/or write patterns 546, and/or gradients 550. Furthermore, mask patterns and/or write patterns 546 may include one or more patterns 548, and gradients 550 may include gradients of one or more patterns 552.

Instructions in the various modules in the memory 524 may be implemented in a high-level procedural language, an object-oriented programming language, and/or in an assembly or machine language. The programming language may be compiled or interpreted, i.e, configurable or configured to be executed by the processing units 510.

Although the computer system 500 is illustrated as having a number of discrete components, FIG. 5 is intended to be a functional description of the various features that may be present in the computer system 500 rather than as a structural schematic of the embodiments described herein. In practice, and as recognized by those of ordinary skill in the art, the functions of the computer system 500 may be distributed over a large number of servers or computers, with various groups of the servers or computers performing particular subsets of the functions. In some embodiments, some or all of the functionality of the computer system 500 may be implemented in one or more ASICs and/or one or more digital signal processors DSPs.

Note that computer system 500 may: include fewer components or additional components, two or more components may be combined into a single component, and/or a position of one or more components may be changed. In some embodiments the functionality of computer system 500 may be implemented more in hardware and less in software, or less in hardware and more in software, as is known in the art.

Figure 6:
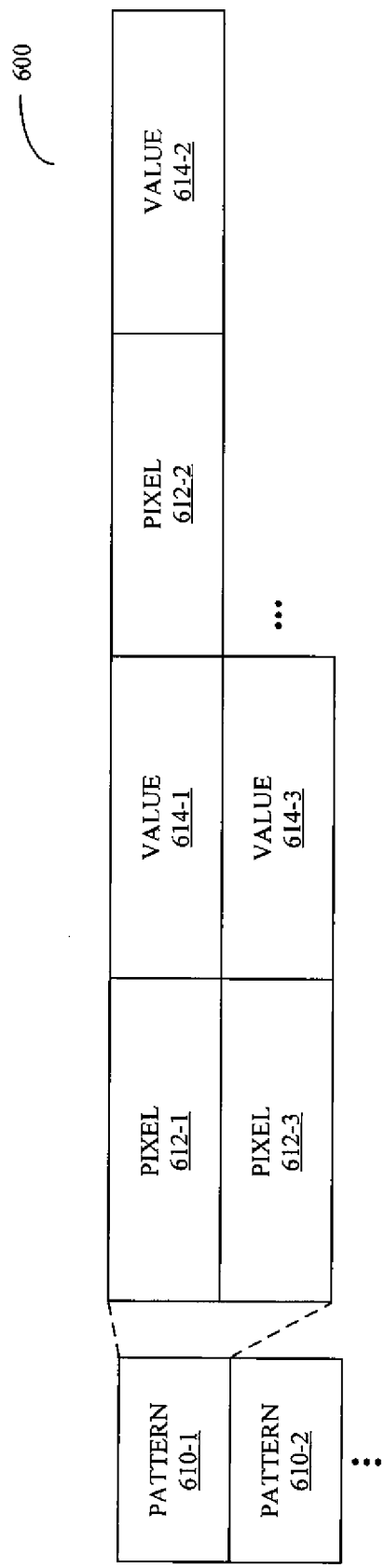
FIG. 6 is a block diagram illustrating a data structure in accordance with an embodiment of the present invention.

We now describe embodiments of a data structure that may be used in the computer system 500. FIG. 6 presents a block diagram illustrating a data structure 600 in accordance with an embodiment of the present invention. This data structure may include information associate with one or more versions of mask patterns and/or write patterns (such as patterns 610). In particular, a given pattern (such as pattern 610-1) may include pixels 612 and associated values 614.

Figure 7:
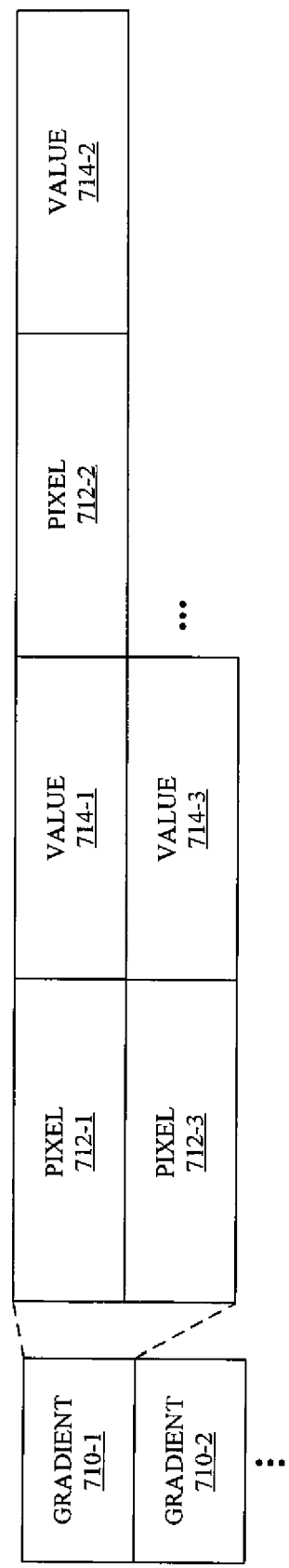
FIG. 7 is a block diagram illustrating a data structure in accordance with an embodiment of the present invention.

FIG. 7 presents a block diagram illustrating a data structure 700. This data structure may include information associated with gradients 710 of patterns (such as the patterns 610), including pixels 712 and associated values 714.

Note that that in some embodiments of the data structure 600 and/or the data structure 700 there may be: fewer or additional components, two or more components may be combined into a single component, and/or a position of one or more components may be changed.

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A computer-implemented method for generating a third mask pattern to be used on a photo-mask in a photolithographic process, comprising:
   adding first features to a first mask pattern to produce a second mask pattern, wherein at least some of the first features have an absolute size characteristic larger than a pre-determined value, wherein the first features are topologically disconnected from second features in the first mask pattern that overlap third features in a target pattern, and wherein the first features are added at positions which are determined based on the gradient of a first cost function depending, at least in part, on the first mask pattern and the target pattern; and
   generating, using the computer, the third mask pattern based on the second mask pattern, wherein the photo-mask corresponds to the third mask pattern.

2. The method of claim 1, wherein the positions correspond to extrema in the gradient.

3. The method of claim 2, wherein the extrema includes a local maximum.

4. The method of claim 2, wherein a given feature in the first features is positioned based on an average of the gradient over a given region in the first mask pattern.

5. The method of claim 1, wherein the size characteristic is determined based on manufacturing capability of the photo-mask in the photolithographic process.

6. The method of claim 1, wherein the size characteristic is a fraction of a ratio of a wavelength of light used in the photolithographic process divided by a numerical aperture of an optical path in the photolithographic process.

7. The method of claim 1, wherein the size characteristic is at least 20 nm.

8. The method of claim 1, further comprising defocusing the first mask pattern prior to adding the first features.

9. The method of claim 1, wherein a second cost function corresponding to the second mask pattern and the target pattern includes a different weighting than the first cost function, and wherein the weighting of the second cost function increases at locations further from the edge.

10. The method of claim 9, the second cost function includes a magnitude of a difference between the target pattern at the image plane and a projection of another photo-mask, corresponding to the second mask pattern, at the image plane in the photolithographic process.

11. The method of claim 1, further comprising enhancing contrast in the first mask pattern prior to adding the first features.

12. The method of claim 1, wherein the first features include sub-resolution assist features.

13. The method of claim 1, the first cost function includes a magnitude of a difference between the target pattern at the image plane and a projection of another photo-mask, corresponding to the first mask pattern, at the image plane in the photolithographic process.

14. The method of claim 1, wherein the third mask pattern has a third cost function relative to the target pattern at the image plane.

15. The method of claim 14, wherein the third cost function includes a magnitude of a difference between the target pattern at the image plane and a projection of the photo-mask at the image plane in the photolithographic process.

16. The method of claim 1, wherein the first features accelerate convergence during the generating of the third mask pattern.

17. The method of claim 16, wherein the convergence is based on a summed value of a third cost function corresponding to the third mask pattern.

18. The method of claim 16, wherein the convergence is based on a manufacturability of the photo-mask corresponding to the third mask pattern.

19. The method of claim 1, wherein the generating of the third mask pattern involves calculating the gradient of a second cost function, and wherein the second cost function includes a magnitude of a difference between the target pattern at the image plane and a projection of the photo-mask at the image plane in the photolithographic process.

20. The method of claim 1, wherein the generating of the third mask pattern involves an inverse lithographic calculation that includes a projection of the target pattern at an object plane in the photolithographic process.

21. The method of claim 1, wherein the first features are positioned based on one or more pre-defined rules.

22. The method of claim 1, wherein the generating of the third mask pattern involves an optical proximity correction.

23. The method of claim 1, further comprising performing a rectilinear projection that approximately conserves areas of enclosed contours in the third mask pattern.

24. The method of claim 1, wherein adding the first features increases a second summed value of the second cost function, corresponding to the second mask pattern, relative to a first summed value the first cost function.

25. The method of claim 24, wherein a third cost function corresponding to the third mask pattern has a third summed value that is less than the second summed value.

26. The method of claim 1, further comprising receiving the first mask pattern.

27. The method of claim 1, further comprising determining the first mask pattern.

* * * * *